United States Patent
Bruijstens et al.

(10) Patent No.: US 10,151,984 B2
(45) Date of Patent: Dec. 11, 2018

(54) LITHOGRAPHIC APPARATUS AND A METHOD OF OPERATING THE APPARATUS

(71) Applicant: ASML NETHERLANDS B.V., Veldhoven (NL)

(72) Inventors: Jeroen Peter Johannes Bruijstens, Eindhoven (NL); Richard Joseph Bruls, Eindhoven (NL); Hans Jansen, Eindhoven (NL); Siebe Landheer, Eindhoven (NL); Laurentius Catrinus Jorritsma, Helmond (NL); Arnout Johannes Meester, Eindhoven (NL); Bauke Jansen, Duerne (NL); Ivo Adam Johannes Thomas, Son (NL); Marcio Alexandre Cano Miranda, Eindhoven (NL); Maurice Martinus Johannes Van Der Lee, Eindhoven (NL); Gheorghe Tanasa, Eindhoven (NL); Lambertus Dominicus Noordam, Overveen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 261 days.

(21) Appl. No.: 14/928,891

(22) Filed: Oct. 30, 2015

(65) Prior Publication Data

US 2016/0124319 A1 May 5, 2016

Related U.S. Application Data

(63) Continuation of application No. 12/559,664, filed on Sep. 15, 2009, now Pat. No. 9,176,371.

(Continued)

(51) Int. Cl.
  *G03F 7/20* (2006.01)
  *G03B 27/52* (2006.01)

(52) U.S. Cl.
  CPC ......... *G03F 7/70341* (2013.01); *G03B 27/52* (2013.01)

(58) Field of Classification Search
  CPC .................. G03F 7/70341; G03F 7/70808
  See application file for complete search history.

(56) References Cited

U.S. PATENT DOCUMENTS

| | | | |
|---|---|---|---|
| 4,509,852 A | 4/1985 | Tabarelli et al. | |
| 6,954,256 B2 | 10/2005 | Flagello et al. | |

(Continued)

FOREIGN PATENT DOCUMENTS

| | | |
|---|---|---|
| EP | 1 420 300 | 5/2004 |
| EP | 1 610 361 | 12/2005 |

(Continued)

OTHER PUBLICATIONS

Japanese Office Action dated Dec. 1, 2015 in corresponding Japanese Patent Application No. 2015-065732.

(Continued)

*Primary Examiner* — Michelle M Iacoletti
(74) *Attorney, Agent, or Firm* — Pillsbury Winthrop Shaw Pittman LLP

(57) ABSTRACT

A lithographic apparatus is disclosed that includes a projection system, and a liquid confinement structure configured to at least partly confine immersion liquid to an immersion space defined by the projection system, the liquid confinement structure and a substrate and/or substrate table. Measures are taken in the lithographic apparatus, for example, to reduce the effect of droplets on the final element of the projection system or to substantially avoid such droplet formation.

21 Claims, 8 Drawing Sheets

Related U.S. Application Data

(60) Provisional application No. 61/174,826, filed on May 1, 2009, provisional application No. 61/150,106, filed on Feb. 5, 2009, provisional application No. 61/097,743, filed on Sep. 17, 2008.

(56) References Cited

U.S. PATENT DOCUMENTS

| | | |
|---|---|---|
| 7,321,415 B2 | 1/2008 | Hazelton et al. |
| 7,405,805 B2 | 7/2008 | Uitterdijk et al. |
| 7,411,653 B2 | 8/2008 | Hoogendam et al. |
| 7,542,127 B2 | 6/2009 | Sengers et al. |
| 7,684,008 B2 | 3/2010 | De Smit et al. |
| 8,233,134 B2 | 7/2012 | Van De Kerkhof et al. |
| 9,182,678 B2 | 11/2015 | Van De Kerkhof et al. |
| 2004/0136494 A1 | 7/2004 | Lof et al. |
| 2004/0207824 A1 | 10/2004 | Lof et al. |
| 2005/0024609 A1 | 2/2005 | De Smit et al. |
| 2005/0094119 A1 | 5/2005 | Loopstra et al. |
| 2005/0128445 A1 | 6/2005 | Hoogendam et al. |
| 2005/0263068 A1 | 12/2005 | Hoogendam et al. |
| 2005/0280789 A1 | 12/2005 | Bruls et al. |
| 2006/0001851 A1 | 1/2006 | Grant et al. |
| 2006/0017894 A1 | 1/2006 | Van Empel et al. |
| 2006/0038968 A1 | 2/2006 | Kemper et al. |
| 2006/0119809 A1 | 6/2006 | Verhagen et al. |
| 2006/0139589 A1 | 6/2006 | Uitterdijk et al. |
| 2006/0158627 A1 | 7/2006 | Kemper et al. |
| 2006/0176456 A1 | 8/2006 | Nagasaka et al. |
| 2006/0209278 A1 | 9/2006 | Kiuchi et al. |
| 2006/0291060 A1 | 12/2006 | Shirai et al. |
| 2007/0081136 A1 | 4/2007 | Hara |
| 2007/0081140 A1 | 4/2007 | Beckers et al. |
| 2007/0109513 A1* | 5/2007 | Leenders ............ G03F 7/70341 355/53 |
| 2007/0126999 A1 | 6/2007 | Poon et al. |
| 2007/0139629 A1 | 6/2007 | Sengers et al. |
| 2007/0188879 A1 | 8/2007 | Ikezawa et al. |
| 2007/0201012 A1 | 8/2007 | Loopstra et al. |
| 2007/0216889 A1 | 9/2007 | Nishii |
| 2007/0268469 A1 | 11/2007 | Fu et al. |
| 2007/0285645 A1 | 12/2007 | Schwertner et al. |
| 2008/0032234 A1 | 2/2008 | Mizutani |
| 2008/0094590 A1 | 4/2008 | Coon |
| 2008/0106718 A1 | 5/2008 | Okada et al. |
| 2008/0130145 A1 | 6/2008 | Schletterer |
| 2008/0192215 A1* | 8/2008 | Gellrich ............ G03F 7/70341 355/30 |
| 2009/0002654 A1 | 1/2009 | Warrick et al. |
| 2009/0059192 A1 | 3/2009 | Beckers et al. |
| 2009/0103070 A1 | 4/2009 | Shirai et al. |
| 2010/0066988 A1 | 3/2010 | Bruijstens et al. |
| 2010/0296067 A1 | 11/2010 | Thomas et al. |

FOREIGN PATENT DOCUMENTS

| | | |
|---|---|---|
| EP | 1 736 831 | 12/2006 |
| JP | 2004-095654 | 3/2004 |
| JP | 2004-259966 | 9/2004 |
| JP | 2004-304145 | 10/2004 |
| JP | 2005-093997 | 4/2005 |
| JP | 2005-136413 | 5/2005 |
| JP | 2006-128192 | 5/2006 |
| JP | 2006-165285 | 6/2006 |
| JP | 2006-165500 | 6/2006 |
| JP | 2006-191066 | 7/2006 |
| JP | 2007-059556 | 3/2007 |
| JP | 2007-110109 | 4/2007 |
| JP | 2007-184336 | 7/2007 |
| JP | 2007-184576 | 7/2007 |
| JP | 2007-519238 | 7/2007 |
| JP | 2007-235088 | 9/2007 |
| JP | 2007-528115 | 10/2007 |
| JP | 2008-010892 | 1/2008 |
| JP | 2008-199069 | 8/2008 |
| JP | 2009-038373 | 2/2009 |
| JP | 2009-536452 | 10/2009 |
| JP | 2010-074160 | 4/2010 |
| KR | 2005-0110033 | 11/2005 |
| KR | 2006-0133917 | 12/2006 |
| TW | 200525290 | 8/2005 |
| WO | 99/49504 | 9/1999 |
| WO | 2005/064405 | 7/2005 |
| WO | 2005/119742 | 12/2005 |
| WO | 2007/128835 | 11/2007 |
| WO | 2008/031576 | 3/2008 |

OTHER PUBLICATIONS

Japanese Office Action dated Oct. 26, 2011 in corresponding Japanese Patent Application No. 2009-208753.
Japanese Office Action dated Oct. 26, 2011 in corresponding Japanese Patent Application No. 2009-208754.
Korean Office Action dated Nov. 30, 2011 in corresponding Korean Patent Application No. 10-2009-0087463.
Japanese Office Action dated Mar. 13, 2012 in corresponding Japanese Patent Application No. 2009-208754.
U.S. Office Action dated Nov. 14, 2012 in corresponding U.S. Appl. No. 12/559,813.
U.S. Office Action dated Jun. 7, 2013 in corresponding U.S. Appl. No. 12/770,356.
U.S. Office Action dated Jul. 15, 2013 in corresponding U.S. Appl. No. 12/559,813.
U.S. Office Action dated Jun. 3, 2016 in corresponding U.S. Appl. No. 14/586,390.
Non-Final Office Action dated Jan. 11, 2018 in corresponding U.S. Appl. No. 15/623,091.

* cited by examiner

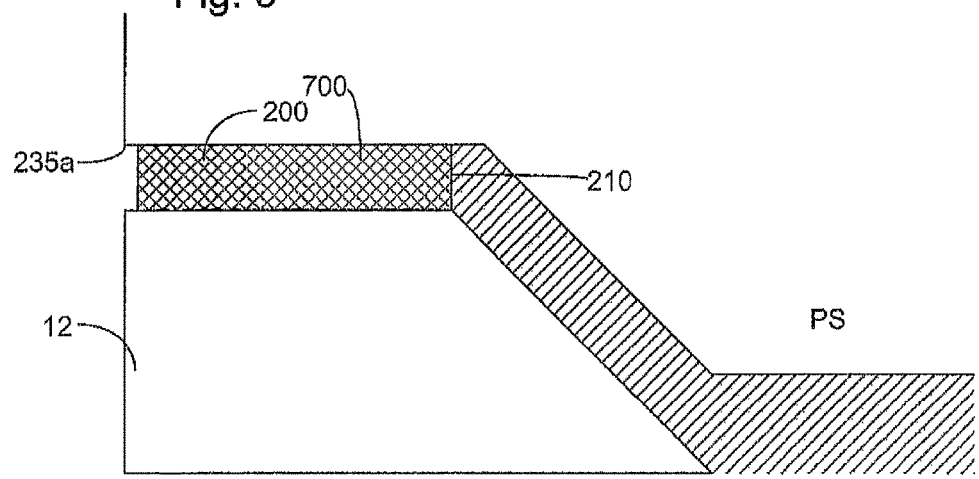
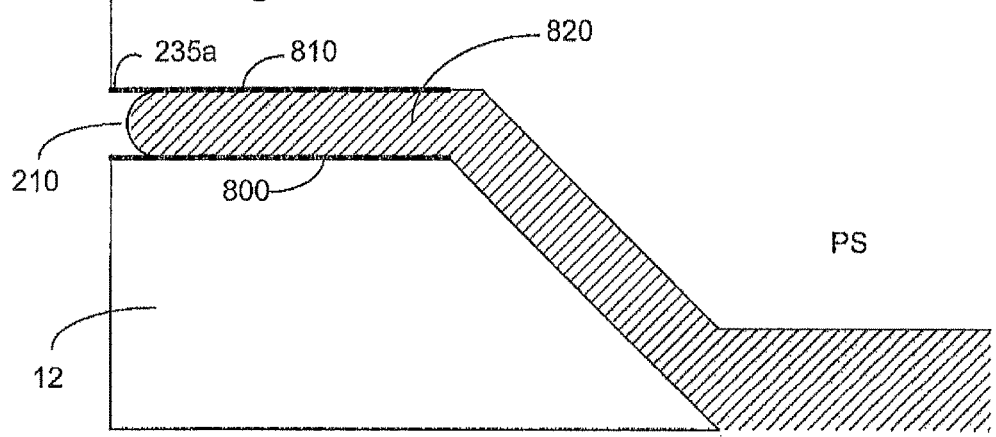
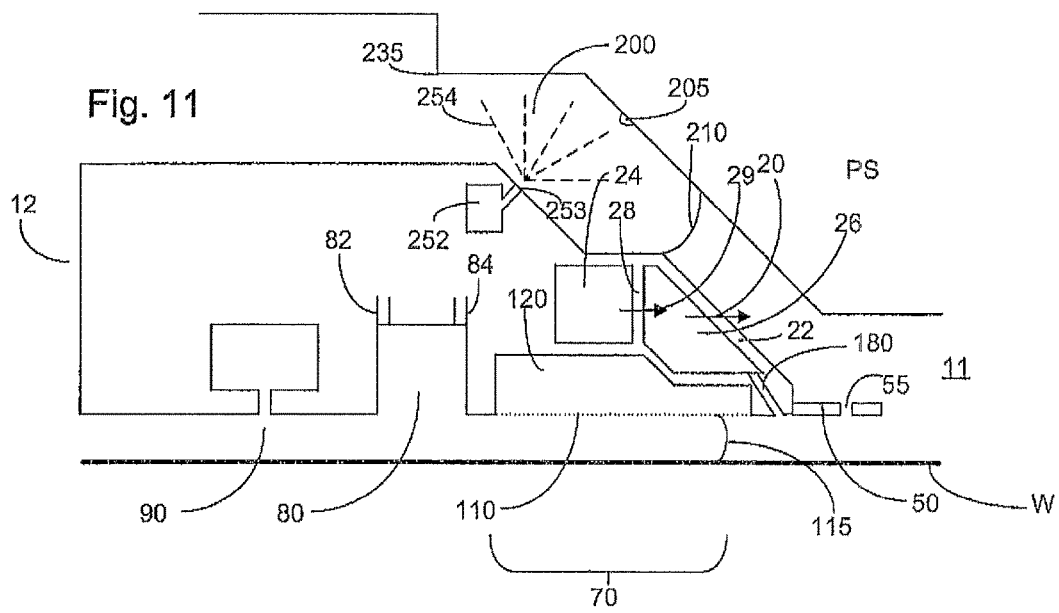

ered, and the entire content of each of the foregoing applications is incorporated herein in by reference.

LITHOGRAPHIC APPARATUS AND A METHOD OF OPERATING THE APPARATUS

This application is a continuation of co-pending U.S. patent application Ser. No. 12/559,664, filed Sep. 15, 2009, which claims priority and benefit under 35 U.S.C. § 119(e) to U.S. Provisional Patent Application No. 61/097,743, entitled "Lithographic Apparatus and a Method of Operating the Apparatus", filed on Sep. 17, 2008, to U.S. Provisional Patent Application No. 61/150,106, entitled "Lithographic Apparatus and a Method of Operating the Apparatus", filed on Feb. 5, 2009, and to U.S. Provisional Patent Application No. 61/174,826, entitled "Lithographic Apparatus and a Method of Operating the Apparatus", filed on May 1, 2009. The entire content of each of the foregoing applications is incorporated herein in by reference.

FIELD

The present invention relates to an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that should be accelerated during a scanning exposure. This may require additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element. Liquid is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PS and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, for example ASML's "Twinscan" lithographic apparatus, the substrate tables swap takes place under the projection system.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

The immersion system may be a fluid handling system or apparatus. In one embodiment the fluid handling system may supply immersion fluid or liquid and therefore be a fluid or liquid supply system. In an embodiment the fluid handling system may confine fluid or liquid and thereby be a fluid or liquid confinement system. In an embodiment the fluid handling system may provide a barrier to fluid or liquid and thereby be a barrier member. In an embodiment the fluid handling system may create or use a flow of gas, for example to help in handling liquid. In an embodiment immersion liquid rather than immersion fluid is used. In that case the fluid handling system may be a liquid handling system. The fluid handling system is located between the projection system and the substrate table.

In a fluid handling system or liquid confinement structure, liquid is confined to a space, for example within a confinement structure by the body of the structure, the underlying surface (e.g. a substrate table, a substrate supported on the substrate table, a shutter member and/or a measurement table) and, in the case of a localized area immersion system, a liquid meniscus between the fluid handling system or liquid confinement structure and the underlying structure i.e. in an immersion space. In the case of an all wet system, liquid is allowed to flow out of the immersion space onto the top surface of the substrate and/or substrate table.

SUMMARY

Droplets of liquid may splash onto the part of the final element of the projection system which is not normally in contact with immersion liquid in the immersion space. Such droplets can then evaporate forming cold spots on the last optical (e.g., lens) element leading to imaging errors and/or focusing errors.

Also, evaporation of liquid around the line defining the boundary between the liquid in the immersion space, gas and the final element of the projection system can have a strong effect on thermal disturbances on the final element of the projection system. This contact line can move due to sloshing of immersion liquid during relative motion between the liquid confinement structure and the substrate. When the line moves down a thin film of liquid can be left behind which evaporates and thermally disturbs the final element of the projection system.

It is therefore desirable, for example, to provide a system to reduce the effect of droplets and/or the gas-liquid final element interface on the final element or substantially to avoid such droplet formation.

In an aspect, there is provided a lithographic apparatus, comprising a projection system; a liquid confinement structure configured at least partly to confine immersion liquid to an immersion space defined by the projection system, the liquid confinement structure and a substrate and/or substrate table; and a barrier extending from the projection system to the liquid confinement structure and around the optical axis of the apparatus to substantially seal a gap between the projection system and the liquid confinement structure, wherein the barrier is compliant substantially to prevent transmission of forces between the projection system and the liquid confinement structure.

In an aspect, there is provided a lithographic apparatus, comprising: a projection system; a liquid confinement structure to at least partly confine immersion liquid to an immersion space defined by the projection system, the liquid confinement structure and a substrate and/or substrate table; and a device to force immersion liquid in a radially outward direction and in contact with a surface of the final element of the projection system and/or to maintain liquid in contact with the surface of the final element of the projection system radially outward of a meniscus extending, in use, between the projection system and the liquid confinement structure.

In an aspect, there is provided a lithographic apparatus wherein an optical element insulator is located between an optically active part of a projection system and a liquid confinement structure and the optical element insulator lies outside of an optical path of the apparatus.

In an aspect, there is provided A lithographic apparatus, comprising a projection system; and a liquid confinement structure configured at least partly to confine immersion liquid to an immersion space defined by projection system, the liquid confinement structure and a substrate and/or substrate table, wherein the liquid confinement structure is partitioned into an upper volume and a lower volume which are separated by a transmissive plate, wherein the liquids in the upper volume and the lower volume are different.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9 depicts, in cross-section, a liquid confinement structure and projection system in accordance with a further embodiment of the invention;

FIG. 10 depicts, in cross-section, a liquid confinement structure and projection system in accordance with a further embodiment of the invention;

FIG. 11 depicts, in cross-section, a liquid confinement structure and projection system in accordance with a further embodiment of the invention;

DETAILED DESCRIPTION

Figure 1:
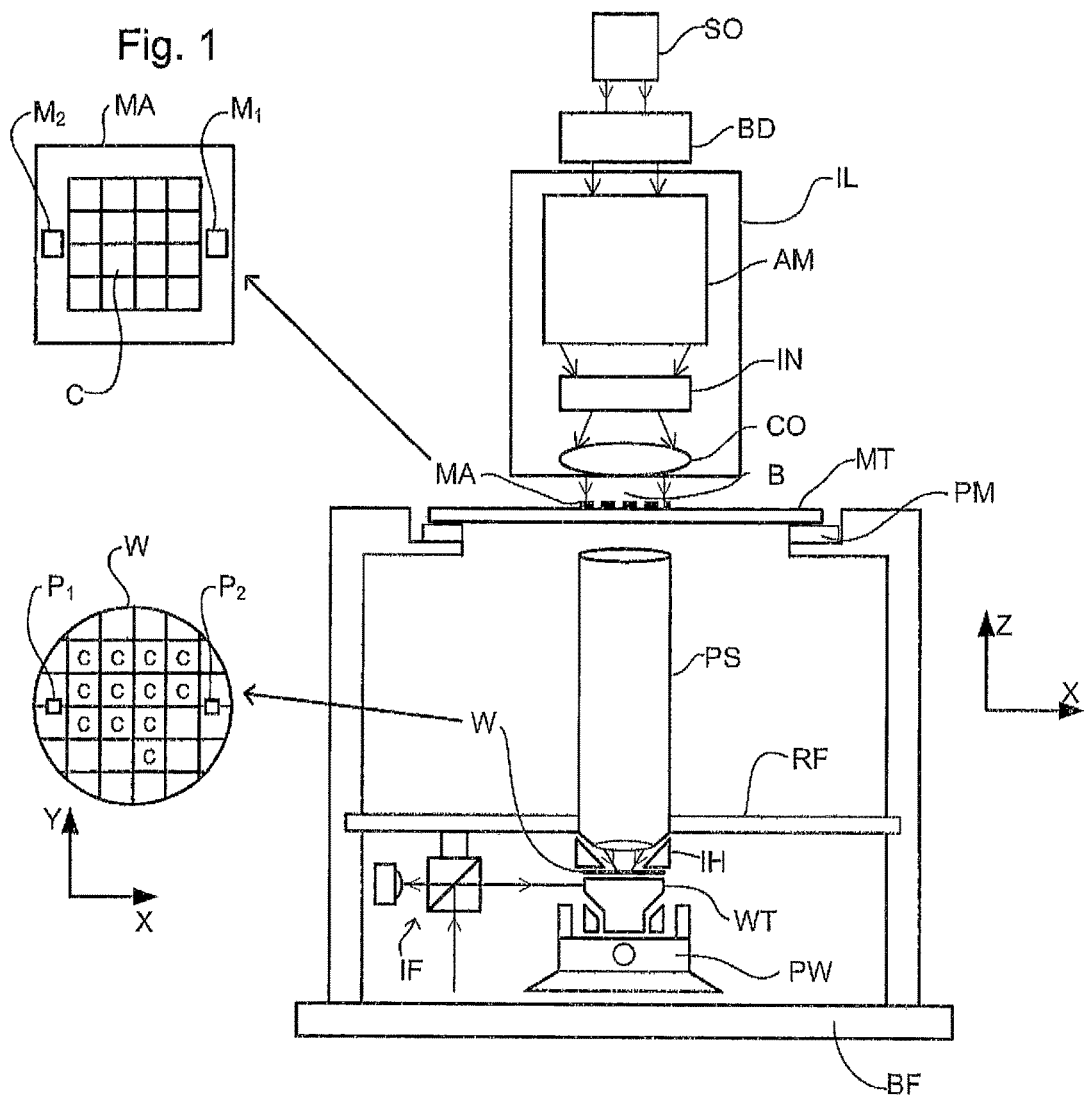
FIG. 1 depicts a lithographic apparatus according to an embodiment of the invention.
Figure 2:
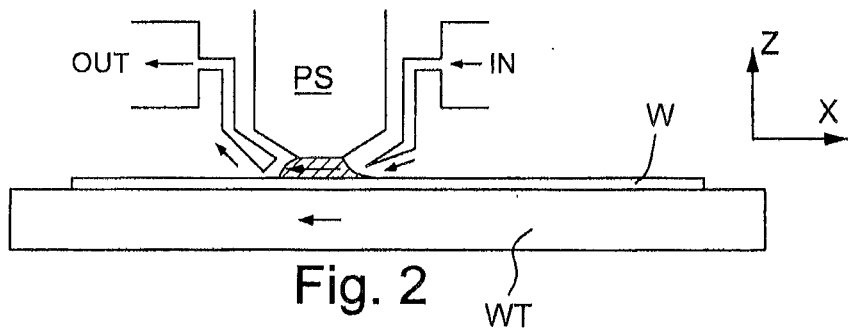
FIGS. 2 and 3 depict a fluid handling structure as a liquid supply system for use in a lithographic projection apparatus.
Figure 3:
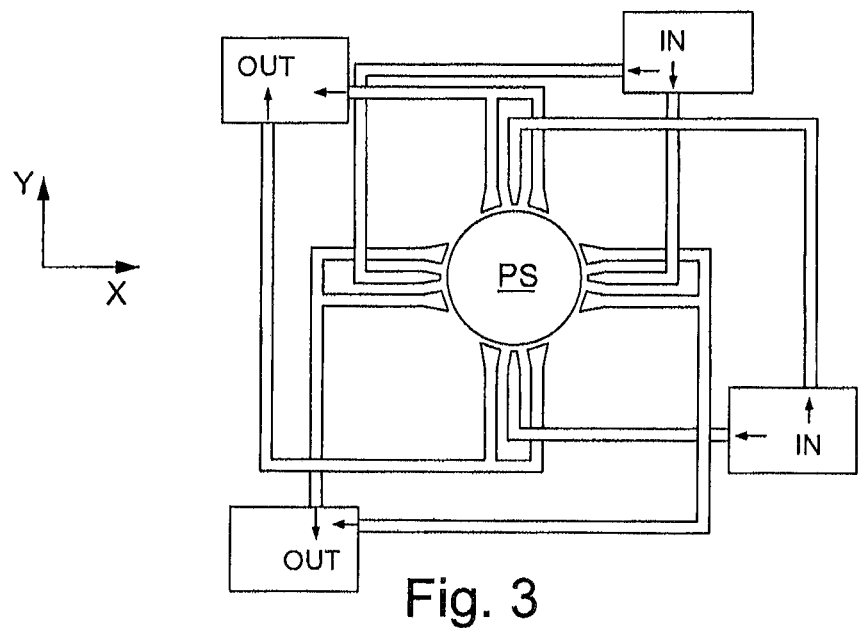
Figure 4:
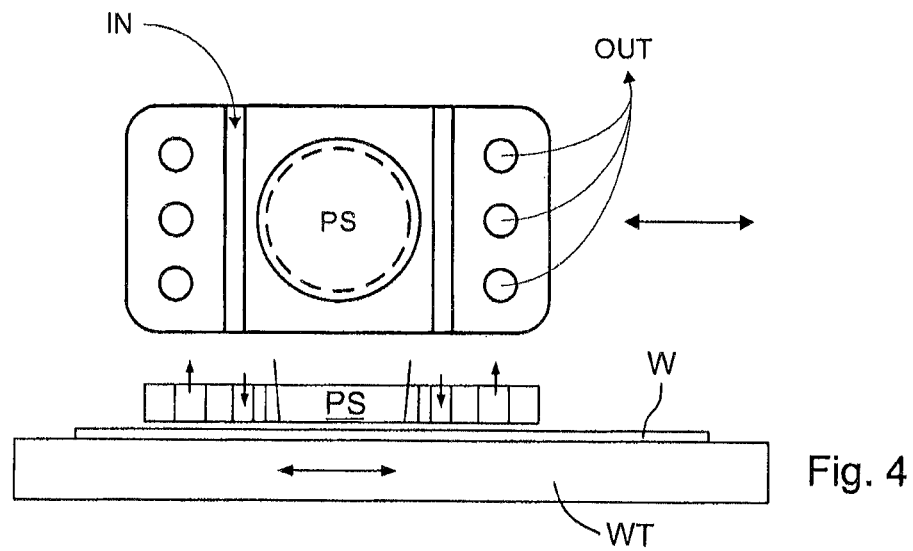
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS. The projection system focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a liquid handling system is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of localized liquid supply systems are illustrated in FIGS. 2-5. The liquid supply systems disclosed in FIGS. 2-4 were described above.

Figure 5:
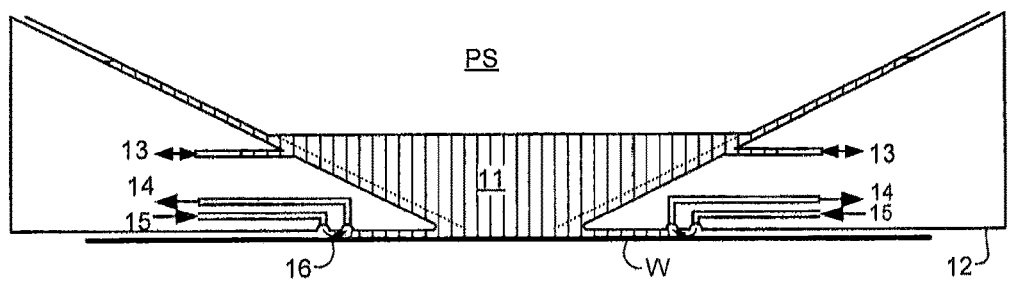
FIG. 5 depicts, in cross-section, a liquid confinement structure which may be used in an embodiment of the present invention as a liquid supply system.

FIG. 5 schematically depicts a localized liquid supply system with a liquid confinement structure 12. The liquid confinement structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure and the surface of the substrate W and may be a contactless seal such as fluid seal, desirably a gas seal.

The liquid confinement structure 12 at least partly contains liquid in the immersion space 11 between a final element of the projection system PS and the substrate W. A contactless seal 16 to the substrate W may be formed around the image field of the projection system so that liquid is confined within the space between the substrate W surface and the final element of the projection system PS. The immersion space is at least partly formed by the liquid confinement structure 12 positioned below and surrounding the final element of the projection system PS. Liquid is brought into the space below the projection system and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the immersion space 11 by a gas seal 16 which, during use, is formed between the bottom of the liquid confinement structure 12 and the surface of the substrate W. Other types of seal are possible, as is no seal (for example in an all wet embodiment) or a seal achieved by capillary forces between the undersurface of the liquid confinement structure 12 and a facing surface, such as the surface of a substrate W, a substrate table WT or a combination of both.

The gas seal 16 is formed by gas, e.g. air or synthetic air but, in an embodiment, N$_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Other arrangements are possible and, as will be clear from the description below, an embodiment of the present invention may use any type of localized liquid supply system as the liquid supply system.

One or more localized liquid supply systems seal between a part of the liquid supply system and a substrate W. The seal may be defined by a meniscus of liquid between the part of the liquid supply system and the substrate W. Relative movement of that part of the liquid supply system and the substrate W may lead to breakdown of the seal, for example the meniscus, and thereby leaking of liquid. The problem may be more significant at high scan velocities. An increased scan velocity is desirable because throughput increases.

Figure 6:
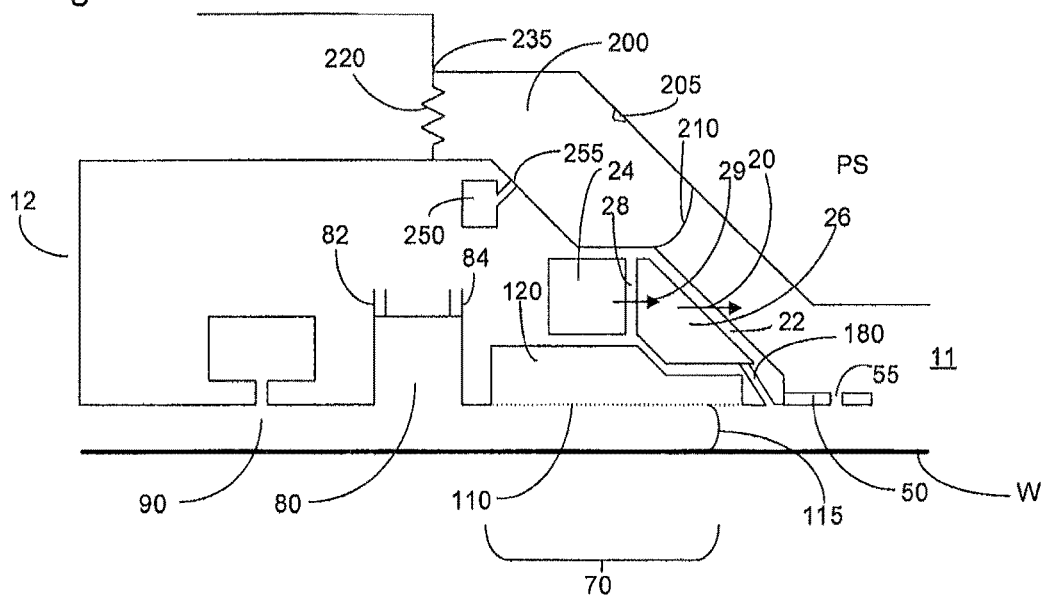
FIG. 6 depicts, in cross-section, a liquid confinement structure and projection system according to an embodiment of the invention.

FIG. 6 illustrates a liquid confinement structure 12 which is part of a liquid supply system. The liquid confinement structure 12 extends around the periphery (e.g., circumference) of the final element of the projection system PS in a plane parallel to the top surface of the substrate table and/or perpendicular to the optical axis such that the liquid confinement structure (which is sometimes called a barrier member or seal member) is, for example, substantially annular in overall shape. That is, the liquid confinement structure encloses the last optical (e.g., lens) element. The liquid confinement structure 12 may be an annulus and may be ring-shaped. The projection system PS may not be circular and the outer edge of the liquid confinement structure 12 may also not be circular so that it is not necessary for the liquid confinement structure 12 to be ring shaped. The liquid confinement structure could also be other shapes so long as it has an opening through which the projection beam may pass out from the final element of the projection system PS. The opening may be centrally located. Thus, during exposure, the projection beam may pass through liquid contained in the opening of the liquid confinement structure and onto the substrate W. The liquid confinement structure 12 may be, for example, substantially rectangular and may not be necessarily the same shape as the final element of the projection system PS is at the height of the liquid confinement structure 12.

The function of the liquid confinement structure 12 is at least partly to maintain or confine liquid in the space 11 between the projection system PS and the substrate W so that the projection beam may pass through the liquid. That space 11 is known as the immersion space. The top level of liquid is simply contained by the presence of the liquid confinement structure 12. The level of liquid in the space is maintained such that the liquid does not overflow over the top of the liquid confinement structure 12.

The immersion liquid is provided to the space 11 by the liquid confinement structure 12 (thus the liquid confinement structure 12 may be considered to be a fluid handling structure). A passageway or flow path for immersion liquid passes through the liquid confinement structure 12. Part of the flow path is comprised by a chamber 26. The chamber 26 has two side walls 28, 22. Liquid passes from chamber 24 through the first side wall 28 into chamber 26 and then through the second side wall 22 into the space 11. A plurality of outlets 20 provide the liquid to the space 11. The liquid passes through through-holes 29, 20 in side walls 28, 22 respectively prior to entering the space 11. The location of the through holes 20, 29 may be irregular.

A seal is provided between the bottom of the liquid confinement structure 12 and the substrate W (This feature indicates that the liquid confinement structure 12 may be a fluid handling structure). In FIG. 6 a seal device is configured to provide a contactless seal and is made up of several components. Radially outwardly from the optical axis of the projection system PS, there is provided a (optional) flow control plate 50 which extends into the space (though not into the path of the projection beam) which helps maintain substantially parallel flow of the immersion liquid out of outlet 20 across the space. The flow control plate 50 has through holes 55 in it to reduce the resistance to movement in the direction of the optical axis of the liquid confinement structure 12 relative to the projection system PS and/or substrate W.

Radially outwardly of the flow control plate 50 on the bottom surface of the liquid confinement structure 12 may be an inlet 180. The inlet 180 can provide liquid in a direction towards the substrate W. During imaging this may be useful in preventing bubble formation in the immersion liquid by filling a gap between the substrate W and substrate table WT with liquid.

Radially outwardly of the inlet 180 may be an extractor assembly 70 to extract liquid from between the liquid confinement structure 12 and the substrate W and/or the substrate table WT. The extractor assembly 70 will be described in more detail below and forms part of the contactless seal which is created between the liquid confinement structure 12 and the substrate W. The extractor assembly 70 may operate as a single phase or as a dual phase extractor.

Radially outwardly of the extractor assembly 70 may be a recess 80. The recess is connected through an inlet 82 to the atmosphere. The recess 80 is connected via an outlet 84 to a low pressure source. The inlet 82 may radially outwardly positioned with respect to the outlet 84. Radially outwardly of the recess 80 may be a gas knife 90. An arrangement of the extractor assembly, recess and gas knife is disclosed in detail in United States patent application publication no. US 2006/0158627, incorporated herein its entirety by reference. However, in that document the arrangement of the extractor assembly is different.

The extractor assembly 70 comprises a liquid removal device or extractor or inlet such as the one disclosed in United States patent application publication no. US 2006-0038968, incorporated herein its entirety by reference. Any type of liquid extractor may be used. In an embodiment, the liquid removal device 70 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material 110 prevent ambient gas from being drawn into the chamber 120 of the liquid removal device 70. However, when the surface of the porous material 110 comes into contact with liquid there is no meniscus to restrict flow and the liquid can flow freely into the chamber 120 of the liquid removal device 70. The surface of the porous material 110 extends radially inwardly along the liquid confinement structure 12 (as well as around the space). The rate of extraction through the surface of the porous material 110 varies according to how much of the porous material 110 is covered by liquid.

The porous material 110 has a large number of small holes each with a dimension, e.g. a width, such as a diameter, $d_{hole}$ in the range of 5 to 50 µm. The porous material 110 may be maintained at a height in the range of 50 to 300 µm above a surface from which liquid is to be removed, e.g. the surface of a substrate W. In an embodiment, porous material 110 is at least slightly liquidphilic, i.e. having a contact angle of less than 90°, desirably less than 85° or desirably less than 80°, to the immersion liquid, e.g. water.

It may not always be possible to prevent gas being drawn into the liquid removal device but the porous material 110 will prevent large uneven flows that may cause vibration. Micro-sieves made by electroforming, photoetching and/or laser cutting can be used as the porous material 110. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

During scanning of the substrate W (during which the substrate W moves under the liquid confinement structure 12 and projection system PS) the meniscus 115 extending between the substrate W and the liquid confinement structure 12 may be drawn either towards or away from the optical axis by a drag force applied by the moving substrate W. This can lead to liquid loss which may result in: evaporation of the liquid, cooling of the substrate W, and consequent shrinkage and overlay errors as described above. Liquid stains may also or alternatively be left behind from interaction between the liquid droplets and resist photochemistry.

Although not specifically illustrated in FIG. 6, the liquid supply system has an arrangement to deal with variations in the level of the liquid. This is so that liquid which builds up between the projection system PS and the liquid confinement structure 12 can be dealt with and does not spill. Such a build-up of liquid might occur during relative movement between the liquid confinement structure 12 and the projection system PS described below; such movement may be referred to as sloshing. One way of dealing with this liquid is to provide the liquid confinement structure 12 so that it is very large so that there is hardly any pressure gradient over the periphery (e.g., circumference) of the liquid confinement structure 12 during relative movement between the liquid confinement structure 12 and the projection system PS. In an alternative or additional arrangement, liquid may be removed from the top of the liquid confinement structure 12 using, for example, an extractor such as a single phase extractor similar to the extractor assembly 70. An alternative or additional feature is a liquidphobic (e.g., hydrophobic) coating. The coating may form a band around the top of the liquid confinement structure 12 surrounding the opening and/or around the last (optical) element of the projection system PS. The coating may be radially outward of the optical axis of the projection system PS. The liquidphobic (e.g., hydrophobic) coating helps keep the immersion liquid in the space 11.

An embodiment of the present invention will be described with reference to a liquid confinement structure 12 with the above mentioned structure. However, it will be apparent that any other type of liquid confinement structure or liquid handling system which provides liquid to an immersion space between the final element of the projection system PS and a substrate W may be applied in an embodiment of the invention. A liquid confinement structure or fluid handling system of both a localized area immersion lithographic apparatus and an all wet arrangement may be applied in an embodiment of the invention.

An embodiment of the invention is intended to help solve the problem of cold spots forming on the last optical element caused by evaporating droplets. An embodiment of the invention may prevent evaporation of a droplet 205 within a gas space 200, which could apply an unwanted heat load to a) the liquid confinement structure 12 (although this is not as significant a problem as for the last element); and/or b) the last optical element. A solution is to have an environment saturated or near saturated with vapor of the immersion liquid in a gas space 200 between the final element of the projection system PS, the liquid confinement structure 12 and the immersion space 11. Hereinafter saturated gas will be referred to. This term is intended to include near saturated gas or gas with a vapor pressure of immersion liquid at a level of at least 50% or 60% or 75% or 80% or 90% of the vapor pressure at saturation. The gas is retained by a barrier 220. Different forms of barrier 220 are illustrated in FIGS. 6-9.

The barrier 220 is desirably positioned relative to the optical axis to optimize, e.g. maximize, the benefit of the volume of the gas space 200. The gas space 220 may define an environment of a gas saturated or almost saturated with immersion liquid vapor. The gas space 220 may be desirable for the reasons provided in the previous paragraph. The gas within the gas space 200 is confined relative to the gas radially outward of the barrier 220. That is, the gas outside the barrier 220 may be entrained in a gas flow. Therefore it may be advantageous to position the barrier 220 as far radially outwardly as possible. This would minimize the radially outward portion of the volume between the liquid confinement structure 12 and the final element of the projection system. However, this needs to be balanced against possible loss in through-put if the gas space 200 is too large; it takes time to achieve equilibrium in the gas space 200 and the larger it is the longer it takes to achieve equilibrium which should be achieved before scanning starts. As with all embodiments, it may be desirable to ensure that at least all of the surface, e.g. the downwardly facing surface, of the final element of the projection system is protected from high thermal loads. Therefore, as shown in FIG. 6, the barrier 220 is provided at the radially outward edge 235 of the final element of the projection system. Alternatively the barrier 220 may be provided further radially outwardly. In an embodiment the barrier 220 is provided radially inwardly of the outward edge 235 (see FIG. 8).

Below a certain threshold of saturation in gas, immersion liquid evaporates. Evaporation of liquid, for example as a droplet or a film (hereinafter droplet includes reference to film unless otherwise stated), applies a heat load to the surface on which it is located. At or above the certain threshold of saturation evaporation is significantly reduced, if not stopped. The gas is saturated with the immersion liquid vapor. Thus the evaporation can be reduced or suppressed by ensuring that the entire area that can reduce optical performance if a cold spot is formed on it by evaporation, is surrounded by saturated gas (saturated enough to avoid evaporation of fluid). This volume can be enclosed by using a barrier 220 between the liquid confinement structure 12 and the final element of the projection system PS. If evaporation is avoided, the temperature offset is avoided and therefore the optical aberration is avoided.

Because the saturated gas prevents evaporation of droplets on, for example, the projection system PS, the saturated gas can be considered an insulator. That is, the presence of saturated gas avoids an evaporational heat load being applied to an applicable surface such as the projection system PS. The saturated gas therefore has an insulating effect on the applicable surface such as the projection system PS (and in particular on the final element of the projection system PS (which is in contact with immersion liquid)). Therefore, the saturated gas is an insulator or isolator present between the projection system PS and the liquid confinement system.

In FIG. 6 a gas space 200 is positioned underneath the projection system PS and above the liquid confinement structure 12. Saturated gas can be contained or confined in the gas space 200. Radially inwardly the gas space is bounded by a meniscus 210 of liquid of the immersion space 11. Radially outwardly the humid gas space 200 is bounded by a barrier 220.

In the FIG. 6 embodiment the barrier 220 is in the form of a bellows. The barrier 220 extends from the projection system PS to the liquid confinement structure 12. The barrier extends around the optical axis of the apparatus thereby to seal a gap between the projection system PS and the liquid confinement structure 12 to define the gas space 200. Because the barrier 220 is in the form of a bellows, the barrier 220 is compliant substantially to prevent transmission of forces between the projection system PS and the liquid confinement structure 12.

Although the barrier 220 is illustrated as being connected between and attached to the final element of the projection system PS and the liquid confinement structure 12, this is not necessarily the case. For example, the barrier 220 could extend from a mounting or shielding structure of the projection system PS to the liquid confinement structure 12.

The barrier 220 is attached at one end to the projection system PS and at the other end to the liquid confinement structure 12. However, that is not necessarily the case. In one embodiment, the barrier 220 is not attached at one or both ends and is in contact with the projection system PS and/or the liquid confinement structure 12. The barrier 220 may be held in contact with at least one of the projection system PS and liquid confinement structure 12 by the elasticity of the material of the barrier 220.

The barrier 220 seals the gap between the projection system PS and the liquid confinement structure 12. Thereby the barrier 220 partly defines the gas space 200. The gas space 200 is defined by the barrier 220, the projection system PS, the meniscus 210 extending between the projection system PS and the liquid confinement structure 12.

Desirably the barrier 220 has a stiffness in the direction of the optical axis of less than 1 N/mm, desirably less than 0.5 N/mm.

In one embodiment a saturated gas source 250 may be provided which supplies gas through an orifice 255 in the liquid confinement structure 12 to the gas space 200. Thereby saturated gas can be replenished to the gas space 200. There may be an opening, for example in the liquid confinement structure 12, to extract gas from the gas space 200. The opening may also serve to remove liquid from the immersion space 11. An advantage of this is that because any gas present would be saturated, this would prevent evaporation in the fluid removal system. Also the extracted gas could be resupplied by the saturated gas source 250 to the gas space 200. Alternatively the opening could be solely for gas extraction and one or more separate openings could be provided for removal of liquid from the immersion space 11.

As can be seen, the barrier 220 partitions the space between the projection system PS and the liquid confinement structure 12 into a radially inward space for the saturated gas (i.e. the gas space 200) and a radially outward part in fluid communication with the external atmosphere radially outwardly of the liquid confinement structure 12 and projection system PS.

Figure 7:
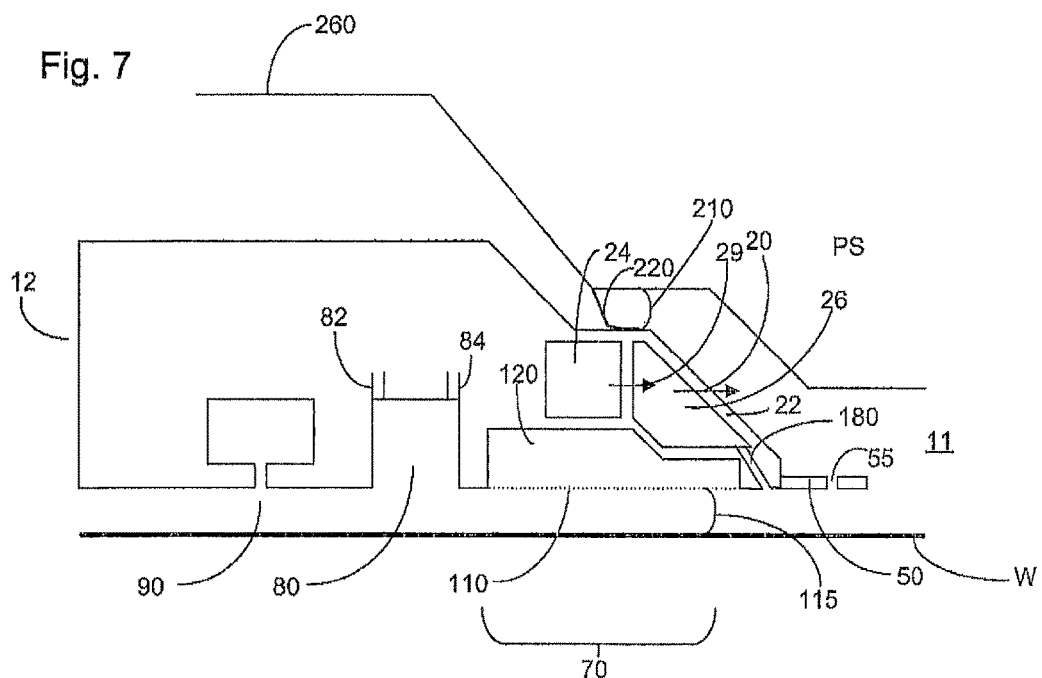
FIG. 7 depicts, in cross-section, a liquid confinement structure and projection system in accordance with a further embodiment of the invention.

FIG. 7 illustrates a further embodiment which is the same as the embodiment of FIG. 6 except as described below.

In the embodiment illustrated in FIG. 7 the barrier 220 is in the form of a seal, for example an elongate seal, which is attached to the projection system PS and is in contact with the liquid confinement structure 12 due to the elasticity of the material of the barrier 220. Alternatively the barrier 220 may be attached to the liquid confinement structure 12 and in contact with the projection system PS due to the elasticity of the material of the barrier 220. The barrier 220 is, in cross-section, substantially L shaped. A surface rather than an end of the barrier 220 contacts the projection system PS or liquid confinement structure 12 at its free end. The barrier 220 may be made of polymer, such as a fluorpolymer (e.g. viton).

Figure 8:
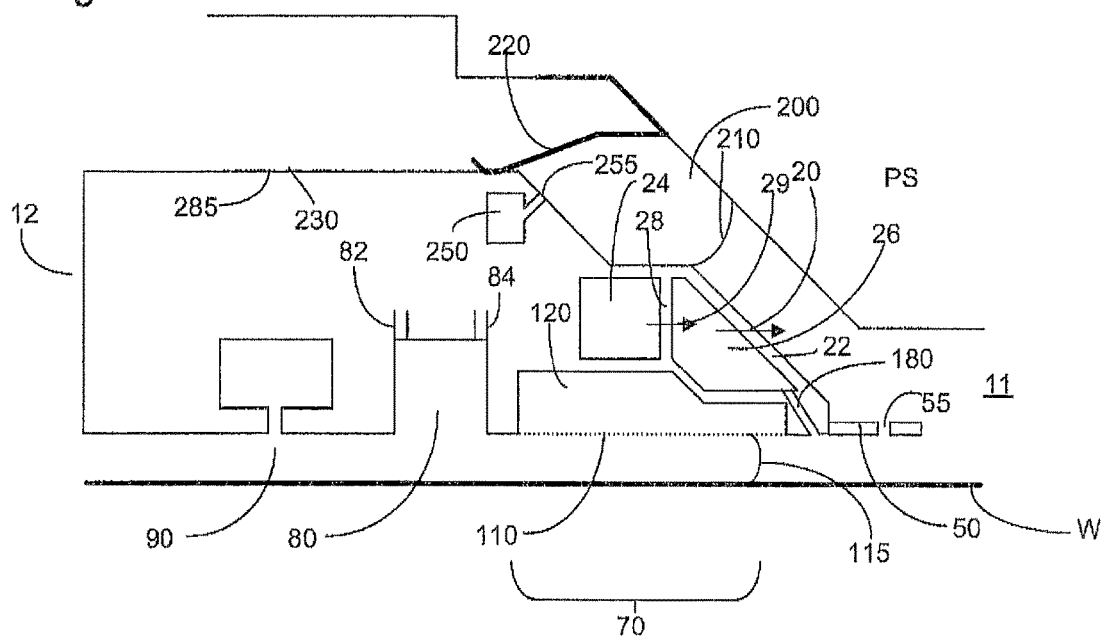
FIG. 8 depicts, in cross-section, a liquid confinement structure and projection system in accordance with a further embodiment of the invention.

FIG. 8 illustrates a further embodiment which is the same as the embodiment of FIG. 7 except as described below.

In the FIG. 8 embodiment the barrier 220 is, in cross-section, a generally V-shaped. The barrier 220 is similar to a leaf spring. It may be glued, adhered or attached along one side of the V to the projection system PS. The barrier 220 is in contact with the liquid confinement structure 12 due to the elasticity of the material of the barrier 220. The barrier 220 could be attached to the projection system PS in another way, for example by clamping or using a fastener. In an embodiment the barrier 220 is glued, adhered or attached to liquid confinement structure 12 and is in contact with the projection system.

FIG. 9 illustrates a further embodiment of the present invention. FIG. 9 is a schematic cross-sectional view through a projection system PS and liquid confinement structure 12. The liquid confinement structure 12 may be any type of liquid confinement structure, for example such as that illustrated in FIG. 6. The embodiment of FIG. 9 is the same as the embodiment of FIG. 6 except as described below.

In the FIG. 9 embodiment, the gas space 200 is at least partly filled by a cellular material 700 made from a solid. The cellular material 700 is desirably an open cell material. The cellular material 700 acts as a barrier in the same way as the barrier 220 in the form of a bellows of the FIG. 6 embodiment. The cellular material 700 may or may not be attached to one or both of the projection system PS and the liquid confinement structure 12, for example by adhering. The cellular material seals the gap between the projection system PS and the barrier 12.

The cellular material 700 extends vertically between the liquid confinement structure 12 and the projection system PS. Thereby substantially no forces are transferred between the projection system PS and the liquid confinement structure 12 through the cellular material 700. Radially inward of the cellular material 700, there may be a gas space 200 before the meniscus 210 of liquid or the meniscus 210 may touch the cellular material 700.

As illustrated, the cellular material 700 is desirably present up to the meniscus 210 of liquid in the immersion space 11 which meniscus extends between the liquid confinement structure 12 and the projection system PS. The cellular material 700 has the effect of preventing evaporation of immersion liquid from, e.g., the projection system PS like the embodiment of FIG. 6. The cellular material prevents/substantially reduces evaporation in contrast to when no cellular material is present. A gas space radially inward of the cellular material 700 is passively (or actively) saturated resulting in a saturated gas space and reduced evaporation. Cells of the cellular material may comprise saturated gas, providing a localized saturated gas space in the cell. The cellular material 700, as illustrated, extends substantially up to an edge 235*a* of the projection system PS. The edge 235*a* may either be the edge of the projection system PS as a whole or the edge of the final element of the projection system PS.

As in the barrier of the embodiment of FIG. 6, the cellular material 700 is compliant substantially to prevent transmission of forces between the projection system PS and the liquid confinement structure 12.

The presence of cellular material 700 is beneficial since it can effectively reduce the free interaction of the immersion liquid with the gas at the other side of the cellular material 700. This reduces or even eliminates the immersion liquid evaporation and its associated cooling effect. The immersion liquid does not pass the cellular material 700. Thereby a lower thermal load is applied to the projection system. The cellular material may allow passage of gas.

Immersion liquid may seep into the cells of the cellular material 700. This can be beneficial in one of two ways. First, the gas environment in the cellular material may become saturated with vapor of the immersion liquid thereby reducing evaporational heat loads in the same way as the gas space 200 of the FIG. 6 embodiment. Alternatively or additionally the immersion liquid may thereby be held in contact with the projection system PS in the cells. This may have a same advantage as the embodiment of FIG. 10 described below and/or may have the additional advantage that the immersion liquid is confined within the cells so that substantially no splashing can occur.

Therefore, as can be seen, the cellular material 700 can be seen as an insulator between the projection system PS and the liquid confinement structure 12 in the same way as the saturated gas of the embodiments in FIGS. 6-8. The cellular material hinders or prevents gas and/or liquid from passing it in a radially outward direction and thereby functions as a seal. The seal transfers substantially no force between the projection system PS and the liquid confinement system 12. In an embodiment the cellular material is a foam such as a sponge.

FIG. 10 shows a further embodiment. The embodiment of FIG. 10 is the same as the embodiment of FIG. 9 except as described below. Embodiments as shown in FIGS. 10-17 do not have any contact between the projection system PS and the liquid confinement structure 12. That is, the projection system PS and liquid confinement structure 12 and any structure between the projection system PS and the liquid confinement structure 12 and attached the projection system PS or liquid confinement structure 12 are spaced apart. In all embodiments at least one of the projection system PS and liquid confinement structure 12 is mechanically decoupled from the structure between the liquid confinement structure 12 and the projection system PS. There is no interconnecting structure between the projection system PS and the liquid confinement structure 12.

In the embodiment of FIG. 10 the meniscus 210 of immersion liquid is forced in a radially outward direction (all radial directions mentioned herein refer as an origin to the optical axis of the projection system PS). Thereby, the meniscus 210 is positioned substantially at a radially outer edge 235*a* of the projection system PS or at least a radially outer edge 235*a* of the final element of the projection system PS. In this way no evaporation of immersion liquid from the surface, e.g. downwardly facing surface, of the final element of the projection system PS is possible. By maintaining immersion liquid in contact with that surface of the final element of the projection system evaporation from that surface of immersion liquid is effectively prevented. Therefore, it can be seen that the immersion liquid itself is insulating the projection system PS from the liquid confinement structure 12, particularly because of the relatively high heat capacity of the immersion liquid and its low coefficient of heat conduction.

In order to force the immersion liquid in a radially outward direction use of capillary force and/or use of one or more liquidphilic surfaces may be made. For example, the projection system PS and liquid confinement structure 12 may be located close together and may have a bottom surface and a top surface respectively shaped to cooperate such that a capillary gap 820 between the two components is formed. This has the effect of driving the liquid radially outwardly under capillary action. Alternatively or additionally the upwardly facing surface 800 of the liquid confinement structure 12 and/or the downwardly facing surface 810 of the projection system PS may be made of a material or have a coating with which the immersion liquid has a receding contact angle of less than 90°, desirably less than 80, 70, 60, 50, 40, 30, 20 or 10° (i.e. is liquidphilic). Such a measure also has the effect of forcing immersion liquid in a radially outward direction compared to where it would be if those surfaces did not have that property with regard to the immersion liquid.

As is illustrated in FIG. 10, only the horizontal surfaces of the liquid confinement structure 12 and the projection system PS are liquidphilic to the immersion liquid. However, other arrangements are possible. For example, only part of the horizontal surface may be liquidphilic to the immersion liquid. Alternatively or additionally non horizontal downwardly facing surfaces of the projection system PS and/or non horizontal upwardly facing surfaces of the liquid confinement structure 12 radially inwardly of the horizontal surfaces illustrated could also be made to be liquidphilic to the immersion liquid. Desirably at least the part of the surface up to the edge 235*a* of the projection system PS or final element of the projection system PS is made to be liquidphilic to the immersion liquid.

A further embodiment is illustrated in FIG. 11. The embodiment of FIG. 11 is the same as the embodiment of FIG. 6 except as described below.

In the embodiment of FIG. 11 no barrier is provided. However, in an embodiment a barrier may be provided.

In the embodiment of FIG. 11 a liquid supply device 252 is provided. The liquid supply device 252 supplies liquid via an opening 253 to the gas space 200. The liquid is desirably provided as a spray 254. In that case the opening 253 may be a spray nozzle. Desirably the liquid is the same as the immersion liquid.

The liquid may be provided in a radially inward direction, in a radially outward direction, or both radially inward and radially outward directions, as illustrated. The liquid is desirably provided continuously. The liquid refreshment rate is higher than the possible evaporation rate of liquid from the meniscus 210. This results in a higher saturation in the gas space 200 than allows for evaporation of liquid from the meniscus 210 or of droplets 205 on the projection system PS.

In an embodiment the spray 254 is provided such that liquid contacts the projection system PS, particularly the final element of the projection system PS, desirably up to the edge 235. In this way evaporation from the final element of the projection system PS is reduced and thereby a temperature fluctuation can be reduced or avoided. Therefore, as with the provision of saturated gas, the spray can be seen as an insulator of the projection system PS.

In other words, the liquid supply device 252 forces liquid (e.g., in a radially outward direction) in contact with the surface, e.g., downwardly facing surface, of the final element of the projection system PS. The liquid supply device 252 also maintains liquid in contact with the surface of the final element of the projection system PS at a position radially outward of the meniscus 210 extending between the projection system PS and the liquid confinement structure 12.

Although the liquid supply device 252 and opening 253 are illustrated as being formed in the liquid confinement structure 12, this is not necessarily the case. In an embodiment the liquid supply device 252 and opening 253 may be formed in a member separate from the liquid confinement structure 12 and the projection system PS. In an embodiment, the liquid supply device 252 and/or the opening 253 is provided in the projection system PS.

Figure 12:
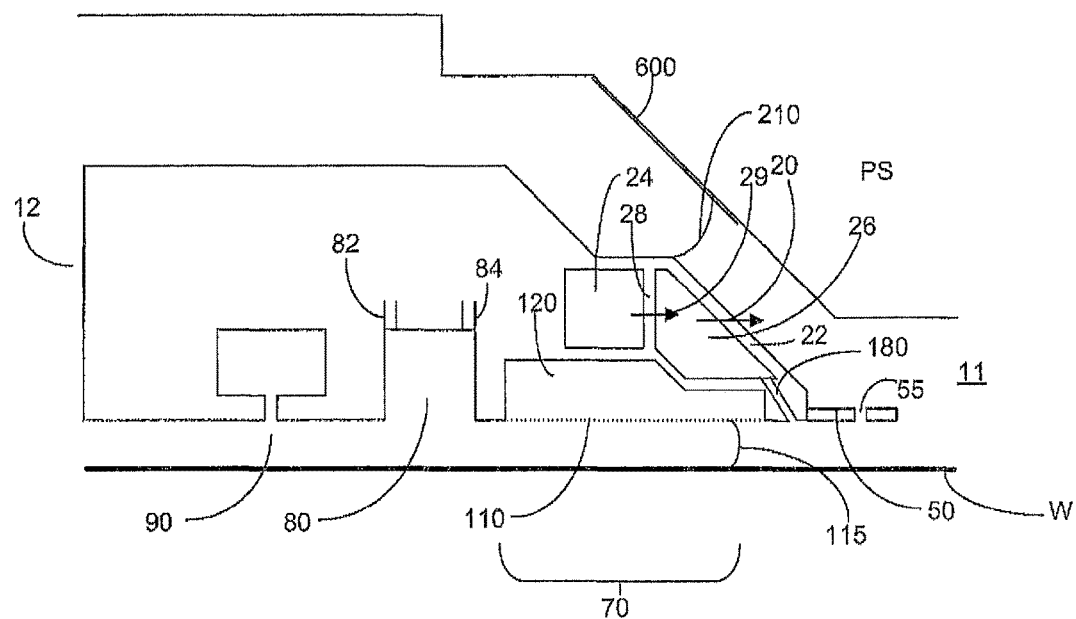
FIG. 12 depicts, in cross-section, a liquid confinement structure and projection system in accordance with a further embodiment of the invention.

FIG. 12 illustrates a further embodiment which is the same as the embodiment of FIG. 6 except as described below.

In the embodiment of FIG. 12, a wetting medium 600, which may be made of fibrous material, is provided on the projection system PS. The wetting medium 600 may be a sheet and may be in the form of mesh or sheet mesh. The wetting medium 600 is attached to the final element of the projection system PS. For example the wetting medium may be attached to a surface by adherence. The wetting medium 600 is positioned in an area where splashing of immersion liquid onto the final element of the projection system is likely.

The wetting medium 600 desirably extends to a position where its end is normally covered by immersion liquid in the immersion space. Capillary action draws liquid up into the mesh 600 from the immersion space. Thereby the wetting medium 600 is substantially always wet with immersion liquid during projecting of the patterned beam.

The wetting medium 600 draws immersion liquid up and, for example, in a radially outward direction (e.g. forces the liquid up) and in contact with a surface, e.g. a downwardly facing surface, of the final element of the projection system PS. The wetting medium 600 also maintains liquid in contact with the surface of the final element of the projection system PS radially outward of the meniscus 210 extending between the projection system and the liquid confinement structure 12.

Additionally or alternatively, any splashes of liquid which fall on the wetting medium 600 are quickly spread out. So any heat load applied by evaporation of that liquid is not applied to a small localized area but applied over a larger area covered by the wetting medium 600.

The wetting medium 600 may be any porous media having adequate porosity/permeability (e.g. enough capillary force) to draw the liquid upwards. In an embodiment the wetting medium 600 is a mesh.

In an embodiment the wetting medium 600 is substantially always wet and liquid evaporates from it. This results in saturated immersion liquid vapor being adjacent to the meniscus 210. Thereby in this embodiment it is accepted that a thermal load is applied to the projection system PS but that thermal load is maintained substantially constant by arranging for the wetting medium 600 to substantially constantly be wet. Because the thermal load is substantially constant, this can be compensated for by other measures in known ways.

Figure 13:
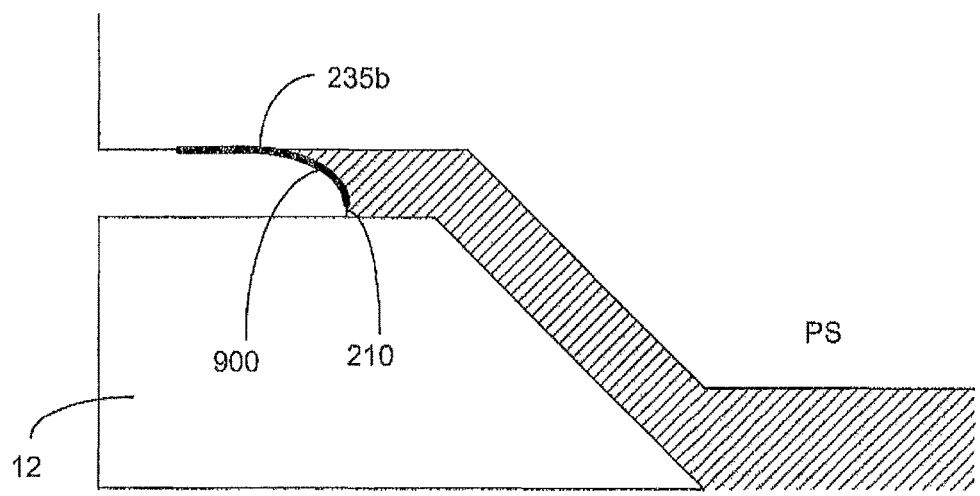
FIG. 13 depicts, in cross-section, a liquid confinement structure and projection system in accordance with a further embodiment of the invention.

A further embodiment is illustrated in FIG. 13. The embodiment of FIG. 13 is similar to the embodiment of FIG. 10 in that it uses the principle that if immersion liquid is present on a surface in bulk, then it cannot impart a significant heat load on the projection system PS due to evaporation. By bulk liquid it is meant liquid which is not droplets and which is desirably in contact with the liquid in the space 11. Therefore, in the embodiment of FIG. 13 a device is provided to maintain immersion liquid in contact with the surface, e.g., the downwardly facing surface, of the final element of the projection system radially outwardly of the meniscus 210 extending between the projection system PS and the liquid confinement structure 12. In the embodiment illustrated in FIG. 13 this is achieved by providing a projection 900 which extends from the projection system PS. The projection 900 extends radially inwardly toward the optical axis. The projection 900 extends downwardly towards the liquid confinement structure 12. The projection 900 may have any shape, in cross-section. In plan, the projection 900 surrounds the optical axis of the projection system PS.

The meniscus 210, which extends between the projection system PS and the liquid confinement structure 12, extends between a free end of the projection 900 and the liquid confinement structure 12. Radially outwardly of the position of the meniscus 210, immersion liquid is maintained in contact with the surface, e.g. a downwardly facing surface, of the projection system up to the position 235b where the projection 900 is attached to the surface of the projection system PS. The position 235b may be at the radially outer most edge of the final element of the projection system PS or may be at the radially outward most position of the projection system PS as a whole, for example. However, the position 235b may be at any other location.

The projection 900 may be, for example annular, with a lower edge having a smaller radius than an upper edge.

The projection 900 does not contact the liquid confinement structure 12. This is advantageous as it therefore does not transfer forces between the projection system PS and the liquid confinement structure 12. Furthermore, if the position of the meniscus 210 varies slightly, this variation in position of attachment is on the liquid confinement structure 12 which is not as sensitive as the projection system PS to variations in temperature (for example due to evaporation).

The meniscus 210 may be pinned to the free end of the projection 900. For example, this may be achieved by providing a change in contact angle of the immersion liquid to the surface of the projection 900 at the free end. Alternatively or additionally, the free end may be made sharp thereby to pin an end of the meniscus 210 to the free end of the projection 900. The free end of the projection 900 may have a point. The projection 900 may be flexible to allow certain movement between the liquid confinement structure 12 and the projection system.

In an embodiment, the projection is attached to the liquid confinement structure 900 and a meniscus 210 interconnects the projection to the surface of the projection system. The arrangement is otherwise as described for the embodiment shown in FIG. 13.

Figure 14:
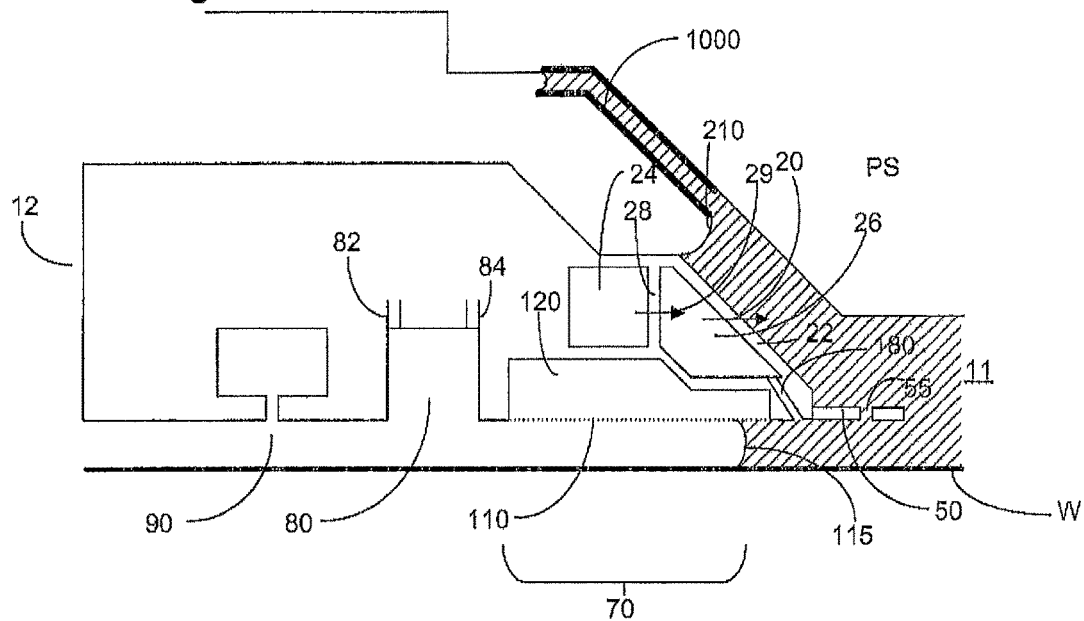
FIG. 14 depicts, in cross-section, a liquid confinement structure and projection system in accordance with a further embodiment of the invention.

FIG. 14 shows a further embodiment of the present invention. The embodiment of FIG. 14 is the same as the embodiment of FIG. 6 except as described below. The embodiment of FIG. 14 has similarities with the embodiments of FIGS. 10, 12 and 13 in that it works on the principle that if the bulk of the immersion liquid is in contact with a surface of the projection system PS, a low heat load will be applied to that surface due to evaporation of the liquid.

In the embodiment of FIG. 14 a device 1000 is provided which forces immersion liquid in a radially outward direction while it is in contact with the surface, e.g. a downwardly facing surface, of the final element of the projection system PS. In the embodiment of FIG. 14 this device is a member 1000. A capillary passage is formed between the member 1000 and the surface of the projection system PS. Liquid from the space 11 is drawn up between the member 1000 and the surface thereby to be in contact with the surface and reduce heat loads applied to the projection system PS in the same way as the embodiments of FIGS. 12 and 13.

Desirably the surface of the member 1000 facing the surface of the final element of the projection system PS and/or the surface of the final element of the projection system PS are made to be lyophilic to the immersion liquid, as in the embodiment of FIG. 10.

As can be seen, as with the embodiment of FIG. 13, the meniscus 210 extends between the liquid confinement structure 12 and an end of the member 1000. The end of the member 1000 to which the meniscus 210 is attached is the radially inner most free end. That radially inner most free end may be treated as in the same way as the free end of the projection 900 of the embodiment of FIG. 13 in order to pin an end of the meniscus 210 to it. In an embodiment, the meniscus 210 may extend between the liquid confinement structure 12 and the outwardly facing surface of the member 1000.

The member 1000 may be attached to the projection system or to a final element of the projection system or to a mount or casing of the projection system PS. It is desirable that the member 1000 is connected to a component other than the projection system, such as its mounting or housing. This is desirable as it would reduce the transfer of forces and/or a thermal load to the projection system. The forces may be disturbance forces from outside the member 1000 or outside the projection system. The forces may be caused by the immersion liquid, the substrate table WT, the liquid confinement structure 12 or movement of the substrate W. In an alternative embodiment, the member 1000 is fixed in place to the projection system PS by capillary force. Alternatively, the member 1000 may be attached to the liquid confinement structure 12, though this is less desired, or to any other structure.

The member 1000 may be attached in any way to the projection system PS or other structure. For example, a plurality of discrete attachment members may be provided in the capillary channel between the member 1000 and the projection system PS in order to attach it to the projection system PS.

The member 1000 is generally plate like and is shaped so that its surface which faces the projection system PS closely conforms in shape to the surface of the projection system PS. Therefore, as can be seen from FIG. 14, the member 1000 ensures that immersion liquid is maintained in contact with the surface of the final element of the projection system PS radially outwardly of the meniscus 210 extending between the projection system PS and the liquid confinement structure 12.

The member 1000 may be made to a desired length so that a desired amount of the surface of the projection system PS is covered. In an embodiment, all of the surface, e.g. a downwardly facing surface, of the final element of the projection system PS is covered. That is, the member 1000 extends substantially to the radially outer edge of the final element of the projection system PS, or further radially outwardly thereof. In an alternative embodiment, the element 1000 may extend even further, for example to the edge of the projection system PS as a whole.

The surface of the member 1000 facing away from the projection system may be made lyophobic. A lyophobic surface may be desirable as a droplet of immersion liquid is less likely to form on such a surface. A heat load applied by the droplet may be avoided.

Figure 15:
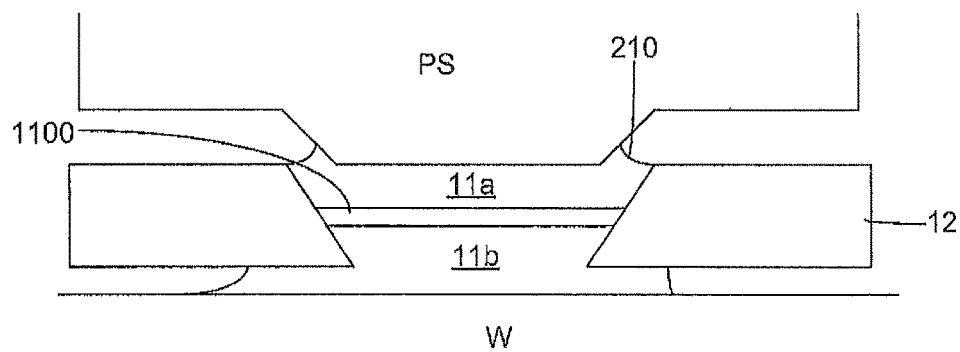
FIG. 15 depicts, in cross-section, a liquid confinement structure and projection system in accordance with a further embodiment of the invention.

A further embodiment is illustrated in FIG. 15. The embodiment of FIG. 15 is the same as the embodiment of FIG. 6 except as described below.

To prevent fluctuations in pressure of immersion liquid in the immersion space due to scan movements affecting the fluid level at the top of the liquid confinement structure 12, the immersion space is divided into an upper volume 11a and a lower volume 11b. This division is made by a transparent plate 1100. Therefore, the upper volume and lower volume 11a, 11b are not in fluid communication and the thermal stability and position of the meniscus 210 in the upper volume 11a can be controlled more accurately. Thereby changes in position of the meniscus 210 can be reduced and the chance of splashing occurring and thereby droplets forming on the projection system PS is also reduced. The transmissive plate 1100 desirably has high transmissivity at the wavelength of the projection system PS and, in an embodiment, a refractive index as close as possible to that of the liquid in either or both the upper and lower volumes 11a, 11b. The transmissive plate 1100 is desirably flat and plane parallel to enable desired imaging requirements to be met. Any deviations from flat (e.g. due to gravity) can be compensated for by the projection system PS as described in U.S. Patent Application Publication No. 2005/0280789. Individual openings for provision and extraction of liquid to the upper and lower volumes 11a, 11b are provided in the liquid confinement structure 12.

The liquid in the upper volume 11a is different to the liquid in the lower volume 11b. For example, the liquid in the upper volume 11a may have a different temperature to liquid in the lower volume 11b. Alternatively or additionally the composition or concentration of the liquid in the upper volume 11a may be different to the composition or concentration in the lower volume 11b.

Figure 16:
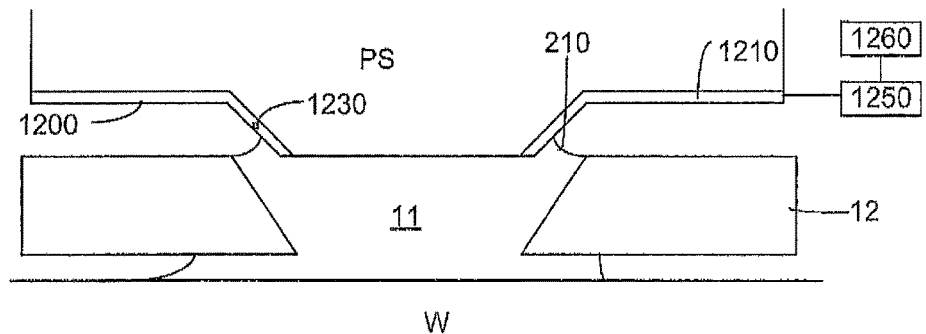
FIG. 16 depicts, in cross-section, a liquid confinement structure and projection system in accordance with a further embodiment of the invention.

FIG. 16 illustrates a further embodiment. The embodiment of FIG. 16 is the same as the embodiment of FIG. 15 except as described below.

In the FIG. 16 embodiment the immersion space 11 is not separated into upper and lower volumes. However, a member 1200 is provided to define a volume 1210 between an edge of the final element of the projection system PS and the member 1200. This volume 1210 is filled with a fluid to thermally condition the final element of the projection system PS.

The volume 1210 surrounds the optical axis of the projection system PS and the projection beam B does not pass through it. That is, the volume 1210 does not extend to underneath the lower surface of the final element of the projection system PS through which the projection beam exits the projection system PS. The member 1200 seals the bottom of the volume 1210 from being in fluid communication with the immersion space 11 at the bottom of the volume 1210.

The meniscus 210 extends between the liquid confinement structure 12 and the member 1200. Any changes in position of the meniscus 210 or droplets forming on the member do not substantially affect the temperature profile of the final element of the projection system PS because the fluid in the volume 1210 is effective to insulate the projection system PS from thermal fluctuations. Thus, the fluid in the volume 1210 can be seen as an optical element insulator which lies outside of an optical path of the apparatus.

A fluid supply device 1250 supplies fluid to the volume. The fluid supply device 1250 may include a fluid conditioning device to condition the temperature of the fluid entering the volume 1210. The fluid may be any fluid provided it is chemically compatible with materials of the final element of the projection system PS and the member 1200.

In an alternative embodiment, the volume 1210 may be comprised of a plurality of discrete channels. Fluid may be provided individually to each of those discrete channels at a desired temperature. The desired temperature may be determined in a feedforward manner, for example. In an embodiment, a sensor 1230 is associated with the or each of the channels. A controller 1260 can then adjust the temperature of the fluid provided to the channel(s) dependent upon the temperature measured by the sensor 1230 associated with the channel. This may be controlled in a feedback loop.

Figure 17:
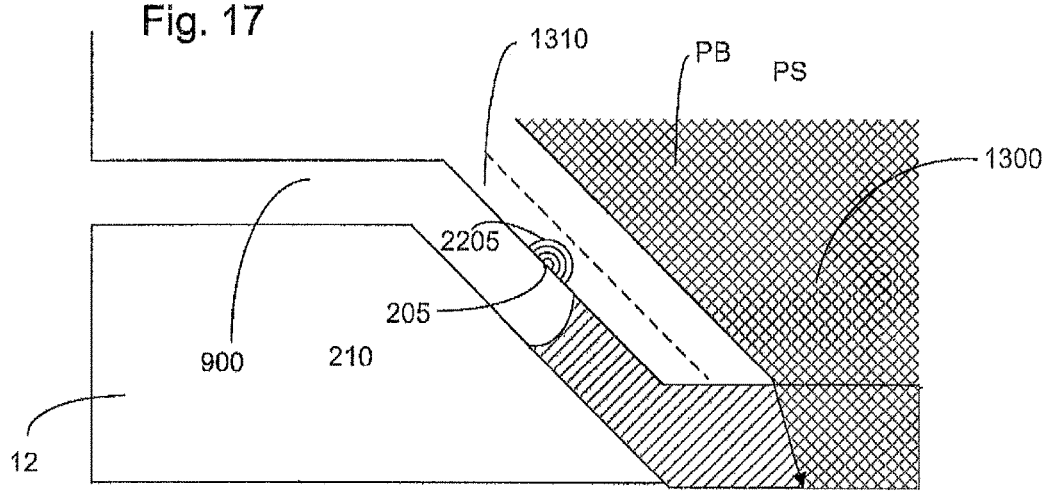
FIG. 17 depicts, in cross-section, a liquid confinement structure and projection system in accordance with a further embodiment of the invention.

A similar embodiment to that of the FIG. 16 embodiment is illustrated in FIG. 17. The FIG. 17 embodiment works on the same principle as the FIG. 16 embodiment of insulating the optically active part of the projection system. This is achieved by making the final element of the projection system PS larger than it needs to be. The final element of the FIG. 17 embodiment comprises an optically active part 1300 through which the projection beam PB (illustrated by crosshatching) passes and an optically inactive part 1310 which lies outside of the optical path of the apparatus. The optically inactive part 1310 surrounds the optical axis and the final element of the projection system PS around an outer edge. The final element insulator does not extend to the bottom of the projection system PS and thereby lies outside of an optical path of the apparatus. The optically inactive part 1310 acts as an insulator helping to ensure that any temperature variation 2205 which occurs, for example due to an evaporating droplet 205, are substantially dampened out before they reach the optically active part 1300 of the final element of the projection system PS. Thus, as in the embodiment of FIG. 16, the optically active part 1300 of the projection system PS is insulated from a thermal variation. The optically inactive part 1310 is desirably at least 3 mm thick.

Instead of making the final element of the projection system PS larger than necessary, it is possible to apply a coating to the radially outer edge of the final element of the projection system PS outside of the optical path of the apparatus.

Desirably the lithographic apparatus comprises a liquid confinement structure which has a surface which surrounds the immersion space and at least partly defines a boundary of the immersion space. Desirably the liquid confinement structure is substantially stationary relative to the projection system. Desirably the liquid confinement structure confines liquid to a localized area of the top surface of the substrate.

The embodiments of FIGS. 6 to 9 may be used in a mode similar to that of FIG. 10. That is, the meniscus 210 of the immersion liquid from the immersion space 11 may extend radially outward to the vicinity of or up to the barrier 220 or cellular material 700. The meniscus 210 may be pinned at the barrier 220 or cellular material 700. The barrier 220 or cellular material 700 may be radially outward or radially inward or coincide with an edge of a surface of the projection system (such as a final element of the projection system), which may be adversely affected by unregulated temperature fluctuations as a consequence of interaction with evaporating immersion liquid. In an embodiment, the immersion liquid is in contact with an entire surface of the projection system PS, for example the final element, such as the lower surface of the final element. The immersion liquid may help maintain the temperature of the surface of the projection system which interacts and/or contacts immersion liquid. Desirably the surface temperature of the projection system in the immersion system may thereby be regulated. A fluctuation in the surface temperature of the projection system which may contact the immersion system may be reduced, if not prevented.

Figure 18:
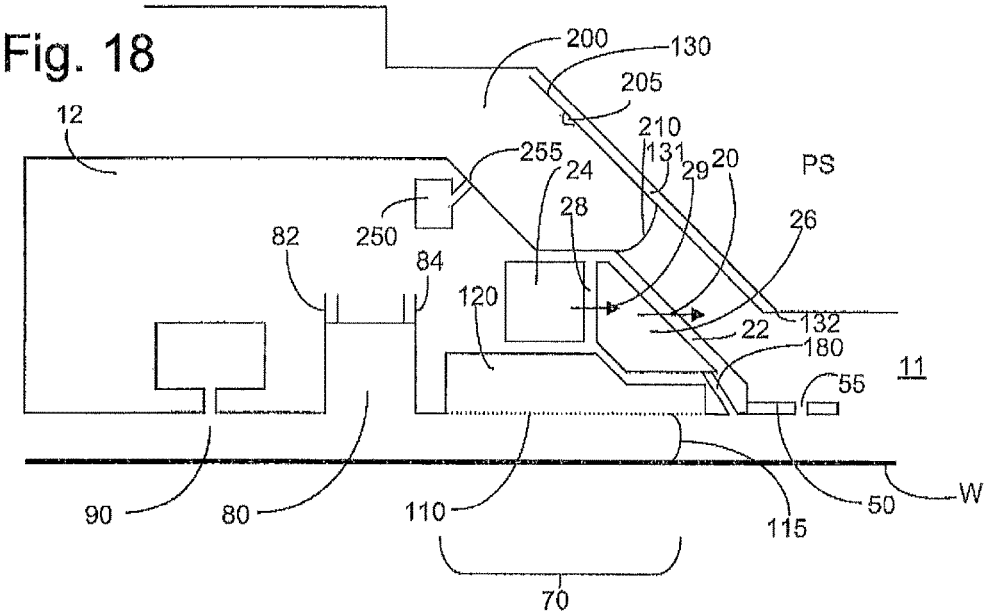
FIG. 18 depicts, in cross-section, a liquid confinement structure and projection system in accordance with a further embodiment of the invention.

A further embodiment is illustrated in FIG. 18 and is the same as the embodiment of FIG. 6 except as described below. The embodiment uses a member 130 which is placed adjacent an optically active part of a final element of the projection system PS. In use, the member is between the immersion liquid and the optically active part.

The member 130 is configured to spread a heat load applied to a localized area of the member by immersion liquid on it onto an area of the optically active part greater than the localized area. The heat load may be applied, e.g., through droplets of the immersion liquid or through immersion liquid from the immersion space 11.

The spreading of the heat load to an area greater than the localized area is achieved by thermal conduction. That is, the member 130 is comprised of a material with a high thermal conductivity (for instance, a material with a higher coefficient of thermal conductivity than the material of the optically active part of the projection system PS). In this way any temperature variation on the member is quickly evened out by thermal conduction. In this way the heat load applied on one side of the member is spread out before any significant effect is felt on the other side of the member (which is close to the optically active part of the projection system PS).

The member 130 is positioned adjacent the optically active part of the final element of the projection system PS. The member 130 lies outside of the optical path of the apparatus. The member 130 surrounds the optical axis of the apparatus and the final element of the projection system PS around an outer edge. As illustrated, the member 130 does not extend to the bottom of the projection system PS and thereby lies outside of the optical path of the apparatus. The member 130 extends into the immersion space 11 so that a meniscus 210 of liquid in the immersion space 11 extends between the member 130 and the liquid confinement structure 12.

The member 130 may be spaced from the final element of the projection system PS. In this way a gap 131 exists between the member 130 and the projection system PS. This gap 131 may be filled with gas or an insulator or may be maintained under a vacuum. The presence of the gap 131 helps to ensure that any temperature variation which does occur in the member 130 is not substantially transmitted into the final element of the projection system PS. A seal 132 may be formed between an end of the member 130 and the final end of the projection system PS at the bottom of the projection system PS.

The member 130 may be attached to the final end of the projection system PS by adherence, for example away from the final end of the projection system PS. For example, the member 130 could be glued to the final end of the projection system PS. Other means of fixing the member 130 to the final end of the projection system PS are possible. In an embodiment, the member 130 is not spaced from the final element of the projection system PS.

In an embodiment, the member 130 is dynamically isolated from the final end of the projection system PS. There may be a dynamic isolator between the member 130 and the final end of the projection system PS. The member 130 may help to prevent pressure fluctuations of the liquid in the immersion space 11 which would otherwise cause undesired vibrations of the final end of the projection system PS. Undesired vibrations of the final end of the projection system PS are undesired because they may deteriorate the image projected on the target portion of the substrate.

A droplet 205 which lands on the member 130 can evaporate and thereby generate a head load on the member 130. Because the member 130 is of a material with a high coefficient of thermal conductivity, the heat load will quickly be dissipated throughout the member 130. This heat dissipation can be aided by having the end of the member 130 immersed in immersion liquid in the immersion space 11. This helps ensure the thermal stability of the member 130. That is, the member 130 is thermally conditioned by the immersion liquid.

In an embodiment, the member 130 is in the form of a coating and there is no gap 131.

In an embodiment, the projection system has a lower surface; and the immersion space comprises, in use, a liquid with a meniscus between a part of the lower surface and a facing surface of the liquid confinement structure facing the part of the lower surface; wherein a pinning surface comprises a plurality of meniscus pinning features, the pinning surface being the part of the lower surface facing the surface of the liquid confinement structure, or the surface of the liquid confinement structure facing the lower surface, or both.

By providing the part of the lower surface facing the surface of the liquid confinement structure or the surface of the liquid confinement structure facing the part of the lower surface, or both, with a plurality of meniscus pinning features the movement of the meniscus 210 due to sloshing is reduced. A plurality of meniscus pinning features may be useful, for example, as there may not be a single meniscus height position around the periphery of the lower surface. There may be differences between the same types of immersion lithographic apparatus resulting in a different height position of the meniscus within these apparatus. Within one apparatus, a changed operating condition of the apparatus may alter the height position of the meniscus. For example in having the liquid confinement structure displaced at different distances away from the lower surface, such as when lowering or raising the liquid confinement structure, or operating at different relative speeds (scanning speeds) the position of the meniscus will change.

Desirably the plurality of meniscus pinning features comprises more than one type of pinning feature which repeats in series over the pinning surface. Desirably one of the types of feature is a first surface and another of the types of feature is a second surface with different surface contact angle than that of the first surface. Desirably the first surface is lyophilic and the second surface is lyophobic. In an embodiment, one of the types of feature is a protrusion and another of the types of feature is a recess. Desirably at least some of the plurality of protrusions define a plurality of steps, and/or at least some of the plurality of protrusions comprises a plurality of grooves and/or the plurality of protrusions are substantially randomly located along a direction away from an optical axis of the projection system. Desirably the surface of each of the protrusions has a displacement of between 1 and 1000 μm from a mean contour, wherein the mean contour is the average displacement of the multiple pinning features of the pinning surface relative to a reference surface. Desirably the series of features repeats in a direction away from an optical axis of the projection system. Desirably a pitch is defined between adjacent features and the pitch is smaller than 5 mm. In an embodiment at least one of the pinning features comprises a fiber. Desirably the plurality of meniscus pinning features are present substantially around the complete periphery of the part of the lower surface facing the surface of the liquid confinement structure, or the surface of the liquid confinement structure facing the part of the lower surface, or both. In an embodiment, the liquid confinement structure or the projection system comprise a removable component comprising the pinning surface. Desirably the removable component is an adhesive sheet. Desirably the removable component comprises metal.

It may be possible to combine certain embodiments. For example, any of embodiments of FIGS. 6-11 and the plurality of pinning features embodiment could be combined with any of the embodiments of FIGS. 14-18.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

The descriptions above are intended to be illustrative, not limiting. Thus, it will be apparent to one skilled in the art that modifications may be made to the invention as described without departing from the scope of the claims set out below.

In an embodiment, there is provided a lithographic apparatus, comprising a projection system and a liquid confinement structure configured at least partly to confine immersion liquid to an immersion space defined by the projection system, the liquid confinement structure and a substrate and/or substrate table. The lithographic apparatus further comprises a barrier extending from the projection system to the liquid confinement structure and around the optical axis of the apparatus to substantially seal a gap between the projection system and the liquid confinement structure. The barrier is compliant substantially to prevent transmission of forces between the projection system and the liquid confinement structure.

The barrier may be attached to only one of the projection system and the liquid confinement structure. The barrier may also be in contact with the other of the projection system and liquid confinement structure. The barrier may be attached to both the projection system and the liquid confinement structure. Alternatively, the barrier may not be attached to either the projection system or the liquid confinement structure.

The barrier may be held in contact with the projection system and/or the liquid confinement structure by the elasticity of the material of the barrier. For example, the barrier is a bellows.

The barrier may extend from a mounting or shielding structure of the projection system to the liquid confinement structure. The barrier may be made of a cellular material, for example an open cell material.

In an embodiment, a lithographic apparatus may comprise a gas space which is defined between the projection system, the liquid confinement structure, the barrier and, in use, the immersion liquid in the immersion space. The gas space may be configured to contain gas substantially saturated with vapor of the immersion liquid. The lithographic apparatus may further comprise a gas source configured to provide gas substantially saturated with vapor of the immersion liquid to the gas space.

During use of the lithographic apparatus, a bulk of immersion liquid in the immersion space may extend substantially to the barrier. In an embodiment, the stiffness of the barrier is less than 1 N/mm. In an embodiment, the liquid confinement structure may allow, in use, liquid to flow onto a top surface of a substrate radially outwardly of the immersion space. The liquid confinement structure may comprise features to form a contactless seal with the substrate to confine liquid to the immersion space.

In an embodiment, a lithographic apparatus may comprise a projection system and a liquid confinement structure to at least partly confine immersion liquid to an immersion space defined by the projection system, the liquid confinement structure and a substrate and/or substrate table. The lithographic apparatus may further comprise a device to force immersion liquid in a radially outward direction and in contact with a surface of the final element of the projection system and/or to maintain liquid in contact with the surface of the final element of the projection system radially outward of a meniscus extending, in use, between the projection system and the liquid confinement structure.

The projection system, the liquid confinement structure, and any structure between the projection system and liquid confinement structure and attached to the projection system or liquid confinement structure, may be spaced apart. The projection system and/or the liquid confinement structure may be mechanically decoupled from the device. The device may comprise an opening for the provision therethrough of immersion liquid onto the surface. The opening may be in the liquid confinement structure. The opening may be a spray nozzle. The device may be configured to force immersion liquid in a radial outward direction or maintain immersion liquid in contact with the surface of the final element of the projection system by capillary force. The device may comprise a wetting medium attached to the final element of the projection system. The device may comprise a member positioned between a part of the final element of the projection system and the liquid confinement structure, wherein a capillary passage to force immersion liquid in a radially outward direction is formed between the member and the final element of the projection system. The member may be a plate member shaped closely to conform with the shape of the surface of the final element.

The device may be configured to maintain immersion liquid in contact with the surface of the final element of the projection system radially outward of a meniscus extending, in use, between the projection system and the liquid confinement structure. The device may comprise a projection extending from the projection system, desirably radially inwardly, towards the liquid confinement structure. The projection may extend around the optical axis of the apparatus. The projection may not contact the liquid confinement structure and the meniscus, in use, extending between the projection system and the liquid confinement structure extends between the free end of the projection and the liquid confinement structure.

The device may be configured to maintain immersion liquid in contact with the surface of the final element of the projection system.

The device may be configured to maintain a liquid other than immersion liquid in contact with the surface of the final element of the projection system.

A volume may be defined between a member of the device and an edge of the final element of the projection system radially outwardly of a bottom surface of the final element of the projection system. The member may seal the volume from being in fluid communication with immersion liquid at a bottom end of the volume. The volume may be filled with a fluid. The lithographic apparatus may further comprise a fluid conditioning unit configured to condition the temperature of fluid in the volume. In use, a meniscus of immersion liquid may extend between the liquid confinement structure and the member. The volume may comprise a plurality of discrete channels. The lithographic apparatus may further comprise a plurality of sensors and a controller. Each sensor may be associated with a channel and configured to detect a temperature in the vicinity of the associated channel. The controller may be configured to adjust the temperature of fluid in each channel dependent upon the measured temperature by the associated sensor.

In an embodiment, a lithographic apparatus may comprise a surface with which the immersion liquid has a receding contact angle of less than 90°, desirably less than 80, 70, 60, 50, 40, 30, 20 or 10°. The surface may be a surface of the projection system and/or a surface of the barrier or device and may include at least a surface of a final element of the projection system.

In an embodiment, the device may be arranged to force the immersion liquid by capillary action, desirably wherein capillary action occurs between an upwardly facing surface of the liquid confinement structure and the downwardly facing surface of the final element of the projection system.

In an embodiment, a lithographic apparatus is provided with an optical element insulator located between an optically active part of a projection system and a liquid confinement structure. The optical element insulator may lie outside of an optical path of the apparatus. The optical element insulator may be material of the final element of the projection system which is not optically active and may be at least 3 mm thick. The optical element insulator may be a coating on a surface of a final element of the projection system and may be adhered to the final optical element of the projection system. In use, a meniscus of liquid may extend between the optical element insulator and the liquid confinement structure. The optical element insulator may comprise a liquid. The liquid may be separate from liquid through which a beam of radiation passes during imaging of a substrate.

In an embodiment, a lithographic apparatus may comprise a projection system and a liquid confinement structure configured at least partly to confine immersion liquid to an immersion space defined by projection system, the liquid confinement structure and a substrate and/or substrate table. The liquid confinement structure may be partitioned into an upper volume and a lower volume which are separated by a transmissive plate. The liquids in the upper volume and the lower volume may be different. The upper liquid and lower liquid may be different in respect of at least property selected from the following properties: temperature, composition, or concentration.

What is claimed is:

1. A lithographic apparatus, comprising:
   a projection system configured to project a patterned radiation beam through an optically active part of a final optical element of the projection system towards a substrate supported by a substrate table;
   a liquid confinement structure to at least partly confine immersion liquid to an immersion space defined by the projection system, the liquid confinement structure and the substrate and/or the substrate table; and
   a member, substantially surrounding the final optical element, located between the projection system and the liquid confinement structure and configured to form a passageway between the member and the optically active part of the final optical element, the passageway being in liquid communication via an opening with the immersion space to allow an immersion liquid flow through the passageway to or from the immersion space and the member spaced apart from the liquid confinement structure to allow a further immersion liquid flow between the member and the liquid confinement structure, wherein, in an operation of the lithographic apparatus, the immersion liquid flow and the further immersion liquid flow originate at a same end of the member and flow along respective major surfaces of the member and a facing surface of the member which faces the liquid confinement structure is configured such that immersion liquid has a contact angle of greater than 90° with the facing surface.

2. The lithographic apparatus of claim 1, wherein the final optical element has an exposure surface through which the patterned radiation beam passes and a bottom surface surrounding the exposure surface, the bottom surface having an outer edge and wherein the passageway extends outwardly of the exposure surface to the outer edge of the surface.

3. The lithographic apparatus of claim 1, wherein the member is supported by the projection system.

4. The lithographic apparatus of claim 3, wherein the member is attached to the final optical element.

5. The lithographic apparatus of claim 1, wherein the passageway is between the member and a non-optically active part of the final optical element through which the patterned beam of radiation does not pass.

6. The lithographic apparatus of claim 1, wherein the member is supported independently of the projection system and the liquid confinement structure.

7. The lithographic apparatus of claim 1, wherein the immersion liquid has a contact angle of less than 90° on at least a part of a surface forming the passageway.

8. The lithographic apparatus of claim 1, further comprising a further opening in liquid communication with the passageway at an end of the passageway opposite to the opening in liquid communication with the immersion space, the further opening being adapted to receive fluid.

9. The lithographic apparatus of claim 1, wherein the passageway extends to cover at least part of a horizontal surface of the final optical element.

10. A lithographic apparatus comprising:
    a projection system configured to project a patterned radiation beam through an optically active part of a final optical element of the projection system towards a substrate supported by a substrate table, the final optical element having an exposure surface through which the patterned radiation beam passes;
    a liquid confinement structure configured to at least partly confine immersion liquid to an immersion space between the final optical element and a surface of the substrate and/or the substrate table; and
    a member, substantially surrounding the final optical element, located between the projection system and the liquid confinement structure and configured to form a passageway between the member and the optically active part of the final optical element, the passageway being in liquid communication via an opening with the immersion space and extending outwardly, with respect to an optical axis of the projection system, of an edge of the exposure surface of the final optical element and being constructed and configured such that, when liquid is in the immersion space, it is filled with liquid from the immersion space by capillary action, wherein, in an operation of the lithographic apparatus, a liquid flow in the passageway and in a space between the member and the liquid confinement structure originates at a same end of the member and flows along respective major surfaces of the member.

11. The lithographic apparatus of claim 10, wherein the final optical element has a bottom surface surrounding the exposure surface, the bottom surface having an outer edge and wherein the passageway extends outwardly of the exposure surface to the outer edge of the surface.

12. The lithographic apparatus of claim 10, wherein the member is supported by the projection system.

13. The lithographic apparatus of claim 10, wherein the member is supported independently of the projection system and the liquid confinement structure.

14. The lithographic apparatus of claim 10, wherein the immersion liquid has a contact angle of greater than 90° on a facing surface of the member which faces the liquid confinement structure.

15. The lithographic apparatus of claim 10, wherein the immersion liquid has a contact angle of less than 90° on at least a part of a surface forming the passageway.

16. The lithographic apparatus of claim 10, further comprising a further opening in liquid communication with the passageway at an end of the passageway opposite to the opening in liquid communication with the immersion space, the further opening being adapted to receive fluid.

17. The lithographic apparatus of claim 10, wherein the passageway extends to cover at least part of a horizontal surface of the final optical element.

18. A lithographic apparatus comprising:
    a projection system configured to project a patterned radiation beam through an optically active part of a final optical element of the projection system towards a substrate supported by a substrate table, the final optical element having an exposure surface through which the patterned radiation beam passes;
    a liquid confinement structure configured to at least partly confine immersion fluid to an immersion space between the final optical element and a surface of the substrate and/or the substrate table; and
    a member, substantially surrounding the final optical element, located in a gap between the projection system and the liquid confinement structure and configured to form a passageway between the member and the final optical element, the member being closer to the final optical element than the liquid confinement structure and the passageway configured to receive liquid, wherein, in an operation of the lithographic apparatus, a liquid flow in the passageway and in a space between the member and the liquid confinement structure originates at a same end of the member and flows along respective major surfaces of the member and wherein the member is supported by the projection system.

19. The lithographic apparatus of claim 18, wherein the passageway is in liquid communication via an opening with the immersion space to allow an immersion fluid flow through the passageway to or from the immersion space.

20. The lithographic apparatus of claim 18, wherein the passageway extends to cover at least part of a horizontal surface of the final optical element.

21. The lithographic apparatus of claim 18, wherein a facing surface of the member which faces the liquid confinement structure is configured such that immersion liquid has a contact angle of greater than 90° with the facing surface.

* * * * *